(12) United States Patent
Chen et al.

(10) Patent No.: US 6,356,216 B1
(45) Date of Patent: Mar. 12, 2002

(54) PROGRAMMABLE CIRCULAR LINKED LIST FOR SEQUENCING SERVO SIGNALS TO MINIMIZE LATENCY

(75) Inventors: Kong-chen Chen, San Jose; Howard Wang, Saratoga, both of CA (US)

(73) Assignee: Oak Technology, Inc., Sunnyvale, CA (US)

( * ) Notice: Subject to any disclaimer, the term of this patent is extended or adjusted under 35 U.S.C. 154(b) by 0 days.

(21) Appl. No.: 09/452,527

(22) Filed: Dec. 1, 1999

(Under 37 CFR 1.47)

(51) Int. Cl.$^7$ ................................. H03M 1/06
(52) U.S. Cl. ......................... 341/118; 360/32
(58) Field of Search .................. 341/155, 143, 341/118; 360/77.08, 78.14, 113, 110, 32

(56) References Cited

U.S. PATENT DOCUMENTS

| | | | |
|---|---|---|---|
| 4,647,873 A | * 3/1987 | Beckner et al. ................. 331/4 |
| 4,647,992 A | 3/1987 | Vinal | |
| 4,910,616 A | 3/1990 | Sirai et al. | |
| 5,475,540 A | 12/1995 | Gold | |
| 5,576,910 A | * 11/1996 | Romano et al. ........... 360/77.8 |
| 5,621,710 A | 4/1997 | Koo | |
| 5,825,318 A | 10/1998 | Patapoutian et al. | |

* cited by examiner

*Primary Examiner*—Peguy JeanPierre
(74) *Attorney, Agent, or Firm*—Martine & Penilla, LLP

(57) ABSTRACT

The present invention provides a method and device for processing servo error signals using a programmable circular linked list to minimize latency. The servo error signals are associated with servo channels. A plurality of data entries are stored in a circular linked list for processing a plurality of servo error signals with one data entry for each servo error channel. Each data entry includes a set of data for processing an associated servo error signal and each set of data includes a time interval that specifies a duration required for processing the associated servo error signal in a digital data format. The time required for converting an analog signal into the digital data format is determined and stored as an ADC conversion time. Then, a data entry is accessed from the circular linked list for processing a servo error signal associated with the data entry. Within the ADC conversion time, the servo error signal is converted into digital data. Upon expiration of the ADC conversion time, the converted digital data is processed to generate correction data. While processing the converted digital data to generate the correction data, a next data entry is accessed from the circular linked list. The servo error signal associated with the next data entry is converted into a next digital data such that the next digital data is generated for generating the next correction data when the previous correction data is generated for output.

22 Claims, 5 Drawing Sheets

PROGRAMMABLE CIRCULAR LINKED LIST FOR SEQUENCING SERVO SIGNALS TO MINIMIZE LATENCY

BACKGROUND OF THE INVENTION

1. Field of the Invention

This invention relates generally to servo loops. More particularly, the present invention relates to programmable circular buffers for reducing latency in servo loops.

2. Description of the Related Art

Modern disc drive systems typically include a feedback control system called "servo loop" that uses feedback to control the position of read/write head. Servo loops are widely used in storage drive systems such as optical disc drive, hard disc drive, floppy disc drive, etc. for focusing and tracking purposes. For example, in an optical drive system, such as CD or DVD, photo-diodes in an optical pick-up unit (OPU) read the laser reflection beam from disc and convert it into photo-currents. The OPU is mounted on a mechanical sled for radial direction movement and houses lasers, photo-detectors, coil current drive electronic circuitry, and the like. The optical disc is clamped on spindle motor and the rotational speed is controlled by a spindle motor servo.

The photo-currents are input to summing or differential amplifiers to generate various signals, such as RF signal, tracing error signal, focus error signal, and so on. These signals are analog in nature and are generally converted into digital format by an Analog-to-Digital converter (ADC) before being input to a Digital Signal Processor (DSP) for processing.

For servo functions, various error signals converted by the ADC will be processed by the DSP to generate responses to maintain the accuracy of focusing, tracking, centering, searching, jumping, tilting, and so on, so that the entire servo system can perform correctly. The responses from the DSP are in digital format and are converted back to analog format by digital-to-analog converters (DAC) before being used by various current drives to perform proper adjustment, such as the height or the angle adjustment for the object lens mounted on the OPU.

A servo loop starts from the laser beam read to the response being feedback for servo parameter adjustment. There are various servo loops for various drives, such as focusing servo loop, tracking servo loop, spindle motor loop, tilt servo loop for optical disc drive, and tracking servo loop for magnetic drive. The timing duration or timing delay from the laser beam read to the adjustment response defines the "latency" of the servo channel.

In general, the performance of a storage drive system improves as the latency decreases. That is, the smaller the latency, the better the servo loop performs. For example, if servo error signals can be monitored or sampled more often, then the disc drive head is less likely to drift substantially from its ideal position. The increase in the servo error signal sampling rate and the reduction in servo response time become more important as the rotational speed of the drive increases and the pitch of storage device decreases.

Typically, low cost servo systems use a single DSP to process all servo error signals in a serial fashion. In such systems, a single high-precision ADC is typically shared by all servo control channels to convert analog servo error signals into digital format. The ADC conversion operations are synchronized with the processor software routine execution associated with the converted digital data.

However, such systems typically exhibit high latency of the servo channel that degrades the performance of the servo system. For example, if the conversion is done too early, the converted data will wait for the DSP to process it. On the other hand, if the conversion is done too late or too slowly, the DSP will be idle waiting for the conversion data to input before a software routine can be invoked.

To reduce latency, one prior art approach has used an interval timer to control the ADC conversion. The interval timer generates a control flag at a fixed timing interval to trigger the ADC to perform data conversion in periodic fashion. In this case, however, the ADC conversion and processor routine execution are not synchronized. For different servo channels, the execution time for different routines are different. Thus, data conversion being triggered at every fixed interval typically does not match varied routine execution time for various servo channels.

In view of the foregoing, there is a need for efficient methods to reduce the servo channel latency so as to improve the analog-to-digital converter utilization rate and the servo performance.

SUMMARY OF THE INVENTION

Broadly speaking, the present invention provides a method and a device for sequencing servo channel signals to minimize latency and phase errors. It should be appreciated that the present invention can be implemented in numerous ways, including as a process, an apparatus, a system, a device, a method, or a computer readable medium. Several inventive embodiments of the present invention are described below.

In one embodiment, the present invention provides a method for processing servo error signals using a programmable circular linked list to minimize latency. The servo error signals are associated with servo channels. In this method, a plurality of data entries are stored in a circular linked list for processing a plurality of servo error signals with one data entry for each servo error channel. Each data entry includes a set of data for processing an associated servo error signal and each set of data includes a time interval that specifies a duration required for processing the associated servo error signal in a digital data format. The time required for converting an analog signal into the digital data format is determined and stored as an ADC conversion time. Then, a data entry is accessed from the circular linked list for processing a servo error signal associated with the data entry. Within the ADC conversion time, the servo error signal is converted into digital data. Upon expiration of the ADC conversion time, the converted digital data is processed to generate correction data. While processing the converted digital data to generate the correction data, a next data entry is accessed from the circular linked list. The servo error signal associated with the next data entry is converted into a next digital data such that the next digital data is generated for generating the next correction data when the previous correction data is generated for output.

In another embodiment, the present invention provides a method for processing servo channel signals using a circular linked list having a plurality of entries for processing a plurality of servo error signals. One entry is provided for each servo error channel. Each entry is programmable to include a set of data for processing a servo error signal. The set of data includes a time interval that specifies a duration needed for processing the digital data corresponding to the associated servo error signal. The servo error signals are associated with servo channels. The method includes: (a) determining and storing a time for converting a servo error signal into a digital data format as an ADC conversion time;

(b) receiving a stream of servo error signals over the servo error channels; (c) accessing an entry from the circular linked list for processing a servo error signal associated with the entry; (d) converting the servo error signal into digital data during the ADC conversion time; (e) upon expiration of the ADC conversion time, processing the converted digital data during the time interval specified in the accessed entry to generate correction data at the end of the time interval; and (f) while processing the converted digital data to generate the correction data, accessing a next entry from the circular linked list at one ADC conversion time before the expiration of the time interval associated with the previous entry and converting a servo error signal associated with the next entry into next digital data such that the next digital data is available for processing when the previous correction data is generated for output.

In yet another embodiment, a servo device is provided for sequencing the processing of servo error signals to minimize latency. The servo device includes an analog switch, an ADC, a circular storage device, and sequencing circuitry. The analog switch is configured to receive a stream of servo error signals, each servo error signal being associated with a servo channel and is operable to select a servo channel signal in response to a channel ID. The ADC is coupled to the analog switch to receive the selected servo channel signal and is operable to convert the selected servo channel signal into servo digital data within an ADC conversion time. The circular storage device is configured to store a circular linked list having a plurality of entries for processing the stream of the plurality of servo error signals. One entry is stored for each servo error channel, each entry being programmable to include a set of data for processing a servo error signal. The stored set of data includes a channel ID and a time interval that specifies a duration needed for processing a digital data corresponding to the associated servo error signal. The sequencing circuitry is configured to sequentially access the entries in the circular linked list for selecting servo error signals for ADC conversion and DSP processing. Further, the sequencing circuitry triggers the ADC to read a next channel ID for ADC conversion at one ADC conversion time before the expiration of the time interval for the previous entry.

Advantageously, the method and device of the present invention optimize servo performance by ensuring that the ADC conversions are performed without any wait states. This reduces the conversion delay and improves the timing latency of servo error signals. In addition, such ADC conversions not only reduce the latency of each servo error signal but also improve the utilization rate of the DSP. Other aspects and advantages of the invention will become apparent from the following detailed description, taken in conjunction with the accompanying drawings, which illustrate by way of example the principles of the invention.

BRIEF DESCRIPTION OF THE DRAWINGS

The present invention will be readily understood by the following detailed description in conjunction with the accompanying drawings, in which like reference numerals designate like structural elements.

DETAILED DESCRIPTION OF THE PREFERRED EMBODIMENTS

The present invention provides a method and device for sequencing servo channel signals to minimize latencies and phase errors. It will be obvious, however, to one skilled in the art, that the present invention may be practiced without some or all of these specific details. In other instances, well known process operations have not been described in detail in order not to unnecessarily obscure the present invention.

The present invention employs a programmable circular buffer to control the start of an ADC data conversion in time to meet a DSP need to minimize the phase error, improve the ADC utilization efficiency, and improve servo channel processing rate. The flexibility of a programmable approach eliminates the rigidity of hardwired approach in handling the servo error signal processing sequence. The programmable approach also supports a flexible number of servo channels, (i.e., the number of servo error signals) to be processed by the DSP. The programmable circular buffer of the present invention can re-arrange the servo channel processing to optimize entire servo system performance with improved ADC utilization rate for any number of servo channels.

Figure 1:
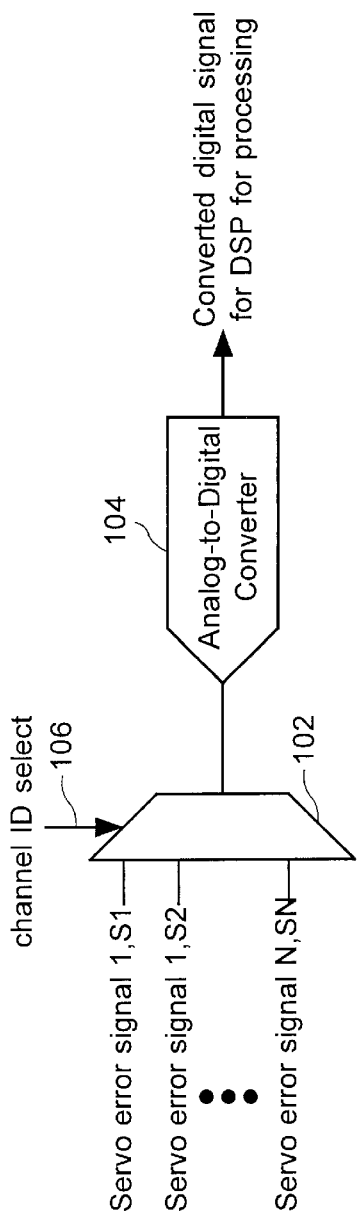
FIG. 1 is a schematic diagram of an analog switch coupled to an ADC for processing analog servo error signals such as tracking error, center error, focus error, tilt error, and the like in accordance with one embodiment of the present invention.

FIG. 1 is a schematic diagram of an analog switch 102 coupled to an ADC 104 for processing analog servo error signals such as tracking error, center error, focus error, tilt error, and the like in accordance with one embodiment of the present invention. The analog switch 102 receives a set of analog servo error signals S1, S2, . . . , SN. Each servo signal in the set of analog servo error signals S1, S2, . . . , SN defines a servo channel. Thus, the number of servo channels in a servo loop is equal to the number of servo error signals received. The analog switch 102 also receives a "channel ID" select signal 106 that indicates which servo channel to select. In response to the channel ID select signal 106, the analog switch selects one of the analog servo error signals corresponding to the selected servo channel and transmits the selected servo error signal to the ADC 104. The analog switch 102 is preferably a multiplexer but it may be implemented using any suitable selecting circuits or circuit elements. The ADC 104 then converts the analog servo error signal into a digital data format. The digital data is then transmitted to a DSP for processing.

Figure 2:
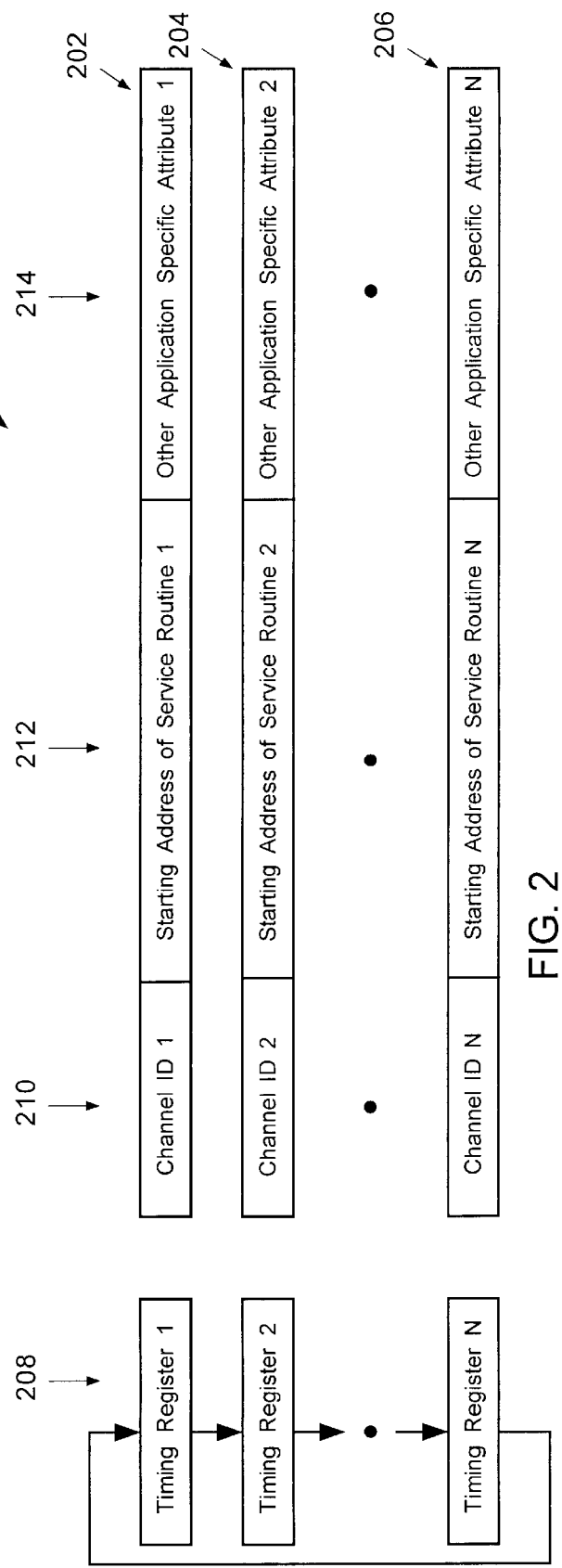
FIG. 2 shows an exemplary circular linked list for sequencing the conversion of the servo error signals and processing of the converted digital data in accordance with one embodiment of the present invention.

In accordance with one embodiment, the present invention provides a programmable "circular linked list," where the tail of the list is linked back to the start of the list to form a circular chain. FIG. 2 shows an exemplary circular linked list 200 for sequencing the conversion of the servo error signals and processing of the converted digital data in accordance with one embodiment of the present invention. The circular linked list 200 includes a set of data entries 202, 204, and 206. Each of the data entries 202, 204, and 205 includes information for sequencing and processing servo channel signal and data. In the illustrated embodiment, each of the data entries 202, 204, and 206 in the circular linked list 200 includes a timing register 208, an active channel ID 210, a starting address of service routine 212, and other optional application specific attributes 214. For example, in servo applications, these attributes may include an enable/disable and group classification control, a pointer to the starting address of the next entry, or even another programmable timing value for triggering the pre-fetching of date for next channel in order to meet real-time applications need.

Each of the timing registers 208 stores a run time (i.e., execution time) required to process a specific servo error signal associated with a specific servo channel using a software service routine. As will be described in more detail below, the execution time values stored in the timing registers are used to control the advancing of data entries 202, 204, and 206 in the linked list 200. The channel ID 210 stores the address or ID of the servo channel with which the corresponding data entry is associated. The channel ID 210 is used as multiplexing control (analog switch control) to select the servo error signal for the ADC 104. Thus, when provided to the analog switch 102, the servo channel ID 210 enables the analog switch 102 to select the analog servo error signal associated with the servo channel ID 210 for conversion into digital data by the ADC 104.

The starting address of service routine 212 contains the starting address of software service routine associated with the current channel. The contents in the other application specific attribute is an optional control, which may be used to control the valid or invalid status of entry in link list, or to control the grouping of link list into subgroups, and so on.

As shown in FIG. 2, the servo entries 202, 204, and 206 are linked in the sequence that they will be processed. Accordingly, any sequence of servo entries may be linked in a desired sequence for processing the servo channel signals. For example, entries corresponding to TE (tracking error), CE (center error), TE, FE (focus error), TE, TIE (tilt error), TE, FE, and so on may be linked in such sequence and then repeated as needed to satisfy desired performance requirements. In addition, to accommodate changes in servo performance or channel requirements, the user may rearrange the order of entries to a new sequence, such as TE, FE, TE, FE, TE, FE, TE, CE, etc. In this manner, the programmable circular linked list seamlessly provides substantial flexibility and performance enhancement. It should be noted that the circular linked list 200 may include any number of entries for processing servo channels.

In one embodiment, the circular linked list 200 is implemented as a set of registers such as a register file. Alternatively, the circular linked list 200 may also be implemented using a random-access-memory (RAM) such as DRAM, SDRAM, EDORAM, SRAM, and the like. In this case, a part of the RAM, which is preferably a data memory, may be allocated to accommodate the entire entries in the circular linked list 200. For sequentially traversing the data entries in the circular linked list 200, pointers are provided to indicate a starting data entry 202 (i.e., start or head pointer) of the linked list 200, an ending data entry 206 (i.e., end or tail pointer) of the link list 200, and a current active entry (i.e., current pointer) in the linked list 200.

In this configuration, the current pointer is initialized with the value of the start pointer at the beginning of the operation so that it points to the first data entry 202 at the beginning. Then, at the end of the current service routine execution, the current entry pointer is updated to point to the next entry 204 in the linked list 200. In so doing, the entries 202, 204, and 206 in the linked list 200 are sequentially traversed by updating the current entry pointer to the next entry. The "circular" feature of the circular linked list 200 is achieved by updating the value of current entry pointer with the value of start pointer after the current entry pointer reaches the end pointer.

Within a servo setting, the sampling rates for various channel signals may vary for different servo loops. For example, a tracking signal is generally sampled and processed more frequently than a focusing signal. Specifically, during tracking, the signal may be processed twice as often as the focusing signal by sampling and processing the tracking signal at every servo loop while sampling and processing the focusing signal at every other servo loop. In this case, the circular linked list 200 may implement different sampling and processing requirements of different channel signals in accordance with one embodiment of the present invention. For example, the circular linked list 200 may include three entries 202, 204, and 206 that correspond to processing of a tracking signal, a focusing signal, and another tracking signal, respectively. In this configuration, in the first servo loop pass, the first two entries 202 and 204 corresponding to the tracking and focusing signals are processed. Then, during the next servo pass, the third entry 206 corresponding to the tracking signal is processed alone. In this manner, the circular linked list 200 may accommodate the different sampling and processing requirements of various channel signals.

Figure 3:
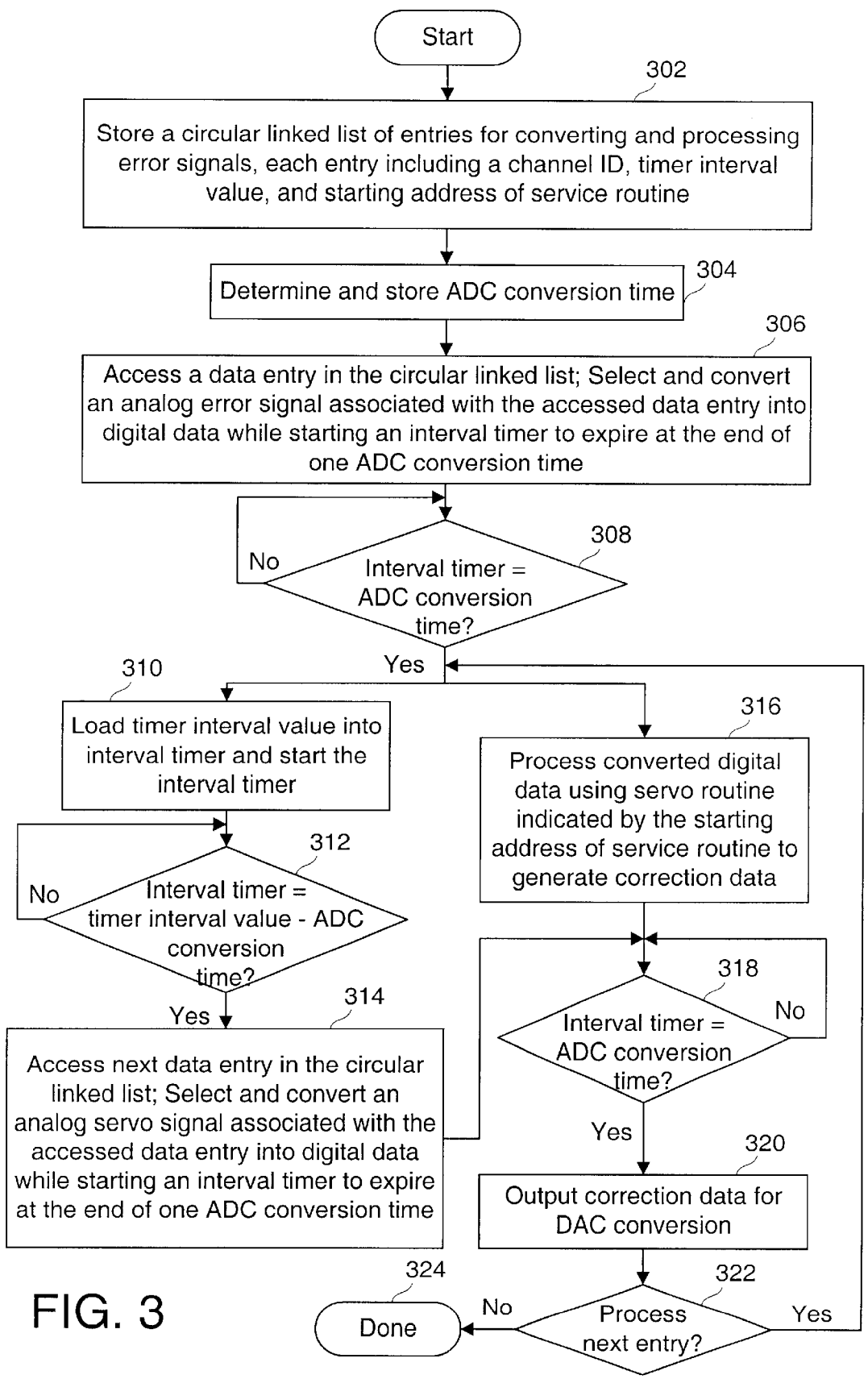
FIG. 3 is a flowchart of an exemplary method for synchronizing the processing of a converted signal with the ADC conversion of another signal in accordance with one embodiment of the present invention.

FIG. 3 is a flowchart of an exemplary method for synchronizing the processing of a converted signal with the ADC conversion of another signal in accordance with one embodiment of the present invention. In this method, a circular linked list of data entries described above are stored in operation 302 for converting and processing error signals. Each entry includes a channel ID, timer interval value, and a starting address of an associated service routine. Service routines are software programs that are executed by a processor (e.g., a DSP) to generate correction data output from converted digital data of an analog error signal. Such programs are well known in the art. Then in operation 304, the time for the ADC 104 to convert an input signal into a digital format is determined and stored in an ADC conversion time register. The conversion time may be determined, for example, by converting a sample servo signal via an ADC. Once the ADC conversion time has been obtained, the time value may be stored in a register or in a memory location for use during servo processing.

Initially, a first data entry in the circular linked list is accessed in operation 306. Based on the accessed data entry, an analog error signal associated with the accessed channel ID is selected and converted into digital data. At the same time, an interval timer is started to keep track of the ADC conversion time. In operation 308, the interval timer value is checked until it is equal to the ADC conversion time.

When the interval timer value becomes equal to the ADC conversion time, the method proceeds to two parallel branches of operations. In one branch, the servo routine associated with the data entry (e.g., first data entry) is executed using the converted digital data to generate a correction data in operation 316. In the other branch, the interval timer is loaded with the timer interval value from the accessed entry and is started in operation 310. Then in operation 312, the interval timer value is checked until it is equal to the timer interval value minus one ADC conversion time. At one ADC conversion time before the timer interval value, the next data entry in the circular linked list is accessed in operation 314. Based on the next data entry, an analog error signal associated with the accessed channel ID is selected and converted into digital data. At the same time, an interval timer is started to keep track of the ADC conversion time. It should be noted that the analog error signal selected in operation 314 is a signal temporally distinct from the previous analog error signal.

In operation 318, the interval timer value is checked until it is equal to the ADC conversion time. When the interval timer value becomes equal to the ADC conversion time, the correction data is output for digital-to-analog (DAC) conversion in operation 320. Then, in operation 322, it is determined whether to process the next data entry. If so, the method proceeds back to the two branches of parallel operations beginning with operations 310 and 316. Otherwise, the method terminates in operation 324. In practice, however, the circular linked list is processed continuously until the device is put into a sleep mode or powered off.

With continuing reference to FIG. 3, it should be noted that operation 318 generally precedes operation 320 except for the last entry of each servo loop pass. In accordance with one embodiment, a servo loop pass may be designed as an interrupt service routine in a DSP firmware implementation. Thus, the entire servo loop pass execution time is less than the servo loop sampling time. Otherwise, other DSP functions may not be able to be processed. In this setting, the output of correction data for the last entry in each servo loop pass is preferably right after the generation of correction data and typically long before the first ADC conversion of the next servo loop pass.

For example, assume that the tracking sampling period and the focusing sample period are 10 $\mu$s and 20 $\mu$s, respectively, and the tracking error correction data and focusing error correction data generation times are 3 $\mu$s and 2 $\mu$s, respectively. Then, the first servo loop pass will involve processing two channel signals: tracking signal of channel 1 for 3 $\mu$s and focusing signal of channel 2 for 7 $\mu$s. On the other hand, the second servo loop pass will involve processing only tracking signal of channel 1 for 10 $\mu$s.

Figure 4A:
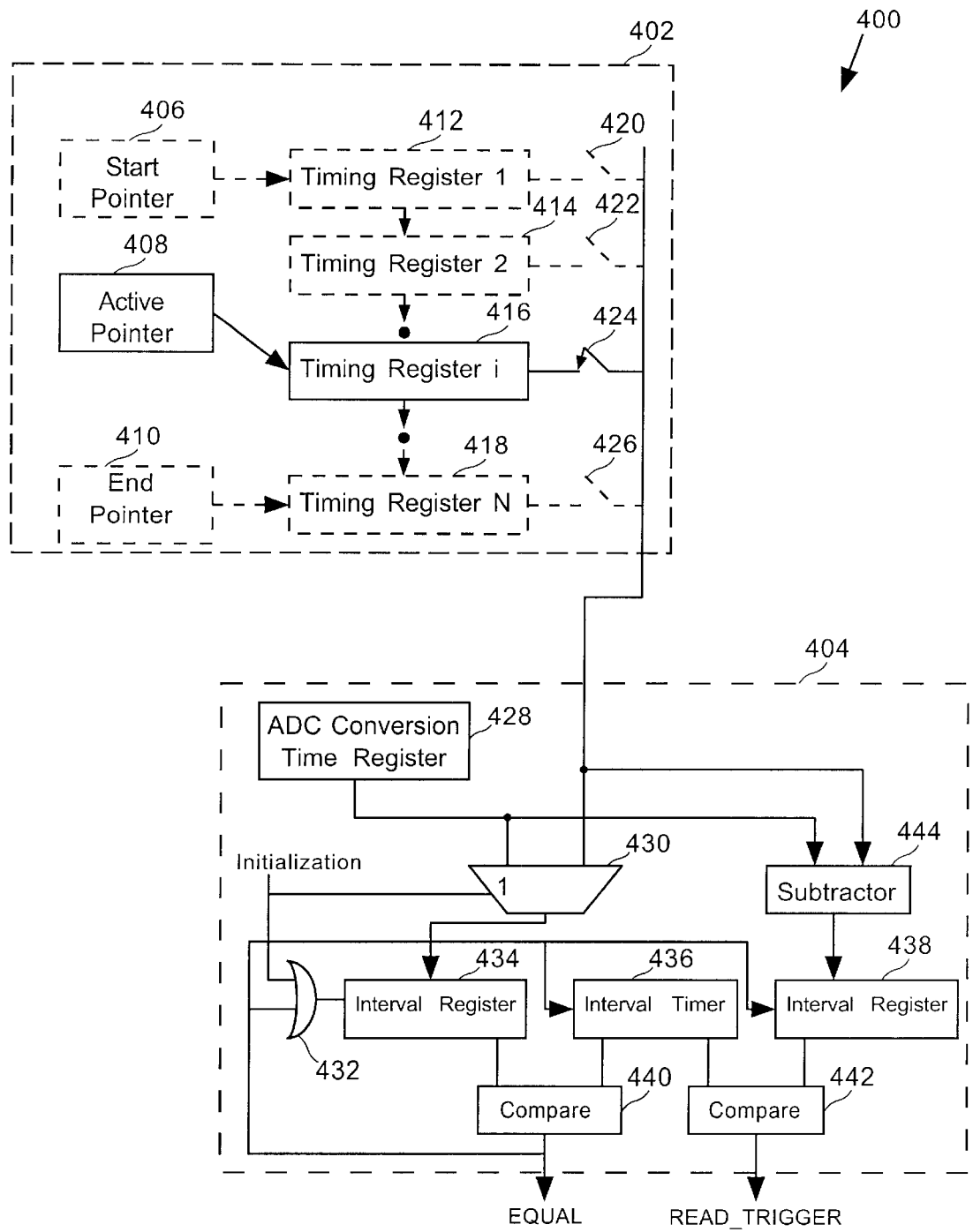
FIG. 4A is a block diagram of a servo sequencer for sequencing the processing of servo error signals and associated digital data in accordance with one embodiment of the present invention.

FIG. 4A is a block diagram of a servo sequencer 400 for sequencing the processing of servo error signals and associated digital data in accordance with one embodiment of the present invention. The servo sequencer 400 includes a circular linked list 402 and sequencing circuitry 404. The circular linked list 402 includes a start pointer register 406, an active pointer register 408, an end pointer register 410, and a plurality of timing registers 412, 414, 416, and 418. It should be appreciated that the simplified circular linked list 402 also includes other fields as described above in FIG. 2. As such, each of the timing registers 412, 414, 416, and 418, which are illustrated herein to describe the timings of various operations, forms a part of an entry in the linked list 402.

The start pointer register 406 stores a start pointer to the timing register 412; an active pointer register 408 stores a current pointer to the timing register 416; and an end pointer register 410 stores an end pointer the timing register 418 in the circular linked list. It should be noted, however, that in practice, the pointer registers 406, 408, and 410 are used to point to the entries, which contain the timing registers. When an entry associated with a timing register becomes active as indicated by the active pointer, the run time value stored in the active timing register 416 is provided to the sequencing circuitry 404 by turning on a switch 424. During this time, other inactive timing registers 412, 414, and 418 are not allowed to provide their contents by turning off switches 420, 422, and 426.

The sequencing circuitry 404 includes an ADC conversion time register 428, an interval register 434, an interval timer 436, an optional interval register 438, a pair of comparators 440 and 442, an OR gate 432, a multiplexer (MU) 430, and a subtractor 444. The ADC conversion time register 428 stores an ADC conversion time, which is the time required by the ADC 104 to convert a servo error signal into a digital data format. The ADC conversion time along with the execution time from an active timing register are provided to the MLUX 430 and the subtractor 444 as inputs. The subtractor 444 subtracts the ADC conversion time from the execution time to generate a read trigger time for triggering the ADC 104 to read a servo error signal associated with the next entry. The read trigger time is then stored in the interval register 438 in response to an EQUAL signal from the comparator 440.

An initialization signal is provided to the MUX 430 and the OR gate 432 to load the interval register 434 with the ADC conversion time from the ADC conversion time register 428. The interval register 434 is thus initially loaded with the ADC conversion time and the interval timer 436 is started simultaneously. The comparator 440 is configured to compare the reference time from the interval register and the time value from the interval timer 436. When the interval timer 436 reaches the reference time of the interval register 434, the comparator generates the EQUAL signal, which is fed back to the OR gate, the interval timer 436, and the interval register 438.

The EQUAL signal from the comparator 440 triggers the loading of an execution time from an active timing register into the interval register 434 and the starting of the interval timer 436. Further, the EQUAL signal also triggers the read trigger time to be loaded into the interval register 438. The comparator 442 receives and compares the time values from the interval timer and the interval register 438. When the time values are equal, the comparator 442 generates a READ_TRIGGER signal to access the next entry in the circular buffer 402 and trigger the ADC 104 to read a signal associated with the next entry.

Figure 4B:
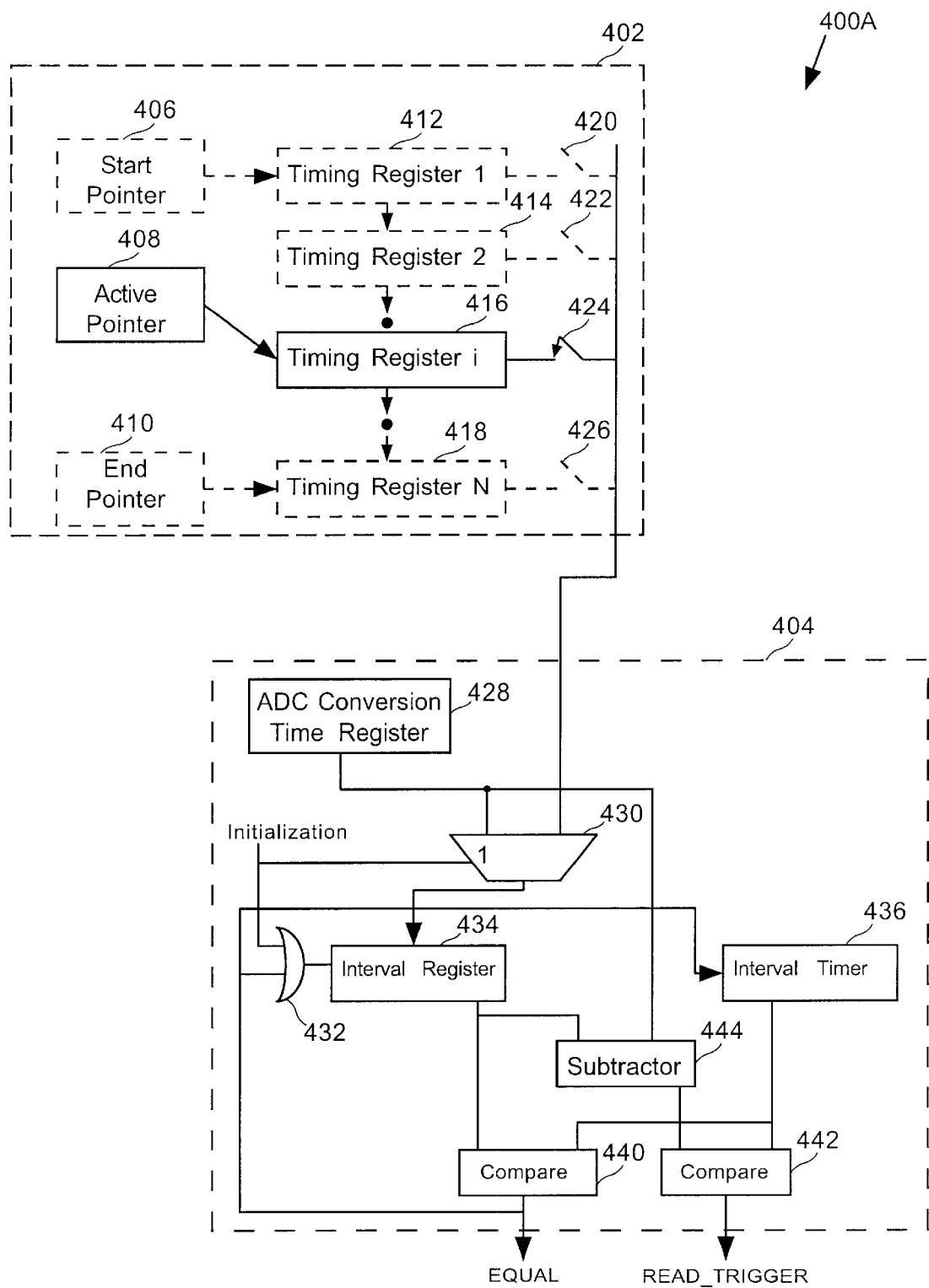
FIG. 4B is a block diagram of the servo sequencer that omits an optional interval register in accordance with another embodiment of the present invention.

The optional interval register in FIG. 4A may be omitted where the conversion time is fixed. For example, FIG. 4B is a block diagram of the servo sequencer 400A that uses only the subtractor 444 in accordance with another embodiment of the present invention. In this embodiment, the interval register 434 is shared for generating the EQUAL flag and READ_TRIGGER signals.

The state machine is composed of a circular link list, where a set of state timing values are linked together in a circular fashion. The number of states in a state machine is flexible and is determined by the number of lists in link list. The advancing of state is controlled by programmable timer. The switching of state is in a predetermined sequence as determined by the order in link list. The duration of stay in each state is determined by the timing value associated with the state timing value recorded in the link list.

Figure 5:
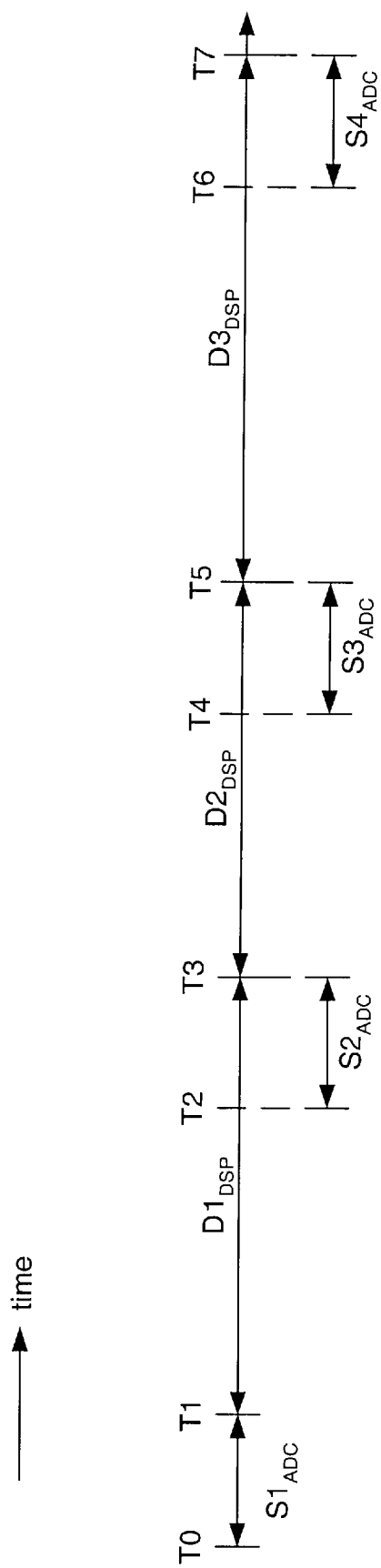
FIG. 5 is a timing diagram of the sequencing of the processing of servo error signals and associated digital data in accordance with one embodiment of the present invention.

FIG. 5 is a timing diagram of the sequencing of the processing of servo error signals and associated digital data in accordance with one embodiment of the present invention. As servo operation starts at time T0, the interval register 434 is initialized with the ADC conversion time and the first Channel ID is read and used as a analog switch control signal to select a servo error signal $S1_{ADC}$ to be converted by ADC 104. At the end of the ADC conversion time (i.e., time T1), the ADC 104 generates digital data $D1_{DSP}$ from the servo error signal $S1_{ADC}$. At the same time, an EQUAL flag is generated to trigger the execution of the software service routine at the location indicated by the starting address of service routine for processing the newly generated digital data $D1_{DSP}$. The EQUAL flag also triggers the loading of the timing value from the first timing register (e.g., timing register 412) to the interval register 434.

Then, at one ADC conversion time before the end of first software routine execution (i.e., time T2), a second ADC conversion is started by reading out the "Channel ID 2" value as ADC's analog switch control and triggering a new ADC conversion process. This timing control can be done by subtracting one ADC conversion time from the timing value in timing register 434. The result of the subtraction result then loaded into the interval register 438. Because the time to trigger the next ADC fetch takes place earlier than the completion time of software routine execution, the interval timer 434 can be used for both counting the software execution time and monitoring the moment to trigger the ADC conversion. Alternatively, a separate interval timer may also be used for such purpose.

Then at time T3, the digital data $D^1DSP$ has been processed to produce correction data for output. In addition, the signal $S2_{ADC}$ has been converted into digital data $D2_{DSP}$ and is available for processing. Similar to time T1, an EQUAL flag is generated to trigger the execution of the software service routine at the location indicated by the starting address of service routine for processing the newly generated digital data $D2_{DSP}$. The EQUAL flag also triggers the loading of the timing value from the second timing register (e.g., timing register 414) into the interval register 434. This process continues repeatedly to meet real time performance requirements of a servo system.

The time value in the timing register 434 reflects the execution time of each servo channel by DSP. With the aid of the interval timer 436, the timing registers 412, 414, 416, and 418 are thus used to control the advance of circular linked list automatically. Such automatic sequencing eliminates all wait states and thereby minimizing latency and maximizing DSP utilization. In addition, because the DSP processing time is typically different for different servo channel, the order of channel ID may be rearranged and proper execution time can be assigned to each timing register in the circular linked list. In this manner, an entire servo system can be re-programmed to a desired sequence to process servo error signals to meet the specific application need. By thus controlling the sampling timing of servo error signals, the present invention improves the servo performance in a flexible, innovated, and cost effective way.

In accordance with another embodiment, the circular linked list circuitry 400 may be further simplified with more firmware implementation. For example, the starting address of service routine may be omitted by providing a table of channel numbers and associated starting address of service routine. Additionally, the ADC conversion time register can be omitted by having the ADC 104 generate an interrupt that indicates the completion of an ADC conversion. To reduce the interrupt overhead, one interrupt mask bit may be implemented in the other application specific attribute. In this configuration, only the first entry in each servo loop pass will request to generate an interrupt.

With reference to FIG. 5, for example, the first entry from the circular linked list is retrieved and its timing register value is stored in the interval register 434 at time T0. At the same time, the ADC 104 receives and converts the first error signal associated with the first entry. Upon completion of the ADC conversion at time T1, the ADC 104 asserts an interrupt to the DSP to generate a corresponding error correction data. When interval timer 436 becomes equal to the interval register 434 at time T2, the second entry from the circular linked list is retrieved to start ADC conversion for the second error signal associated with the second entry. At the completion of the second ADC conversion at time T3, the first error correction data is output to a DAC. The second service routine is then invoked to read the second ADC value for processing the second error correction data.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for processing servo error signals using a programmable circular linked list to minimize latency, the servo error signals being associated with servo channels, the method comprising:

storing a plurality of data entries for processing a plurality of servo error signals, the plurality of data entries being arranged in a circular linked list, one data entry for each servo error channel, each data entry including a set of data for processing an associated servo error signal, each set of data including a time interval that specifies a duration required for processing the associated servo error signal in a digital data format;

determining and storing a time required for converting an analog signal into the digital data format as an ADC conversion time;

accessing a data entry from the circular linked list for processing a servo error signal associated with the data entry;

converting the servo error signal into digital data within the ADC conversion time;

upon expiration of the ADC conversion time, processing the converted digital data to generate a correction data; and while processing the converted digital data to generate the correction data, accessing a next data entry from the circular linked list and converting a servo error signal associated with the next data entry into a next digital data such that the next digital data is generated for generating a next correction data when the previous correction data is generated for output.

2. The method as recited in claim 1, wherein the servo error signal associated with the next data entry is converted one ADC conversion time before the previous correction data is generated for output.

3. The method as recited in claim 1, wherein the servo error signal is provided to an ADC, which converts the servo error signal into the digital data.

4. The method as recited in claim 1, wherein the plurality of data entries are stored in a programmable circular buffer.

5. The method as recited in claim 1, wherein the plurality of data entries are stored in a register file including a plurality of registers.

6. The method as recited in claim 1, wherein each data entry includes a channel ID for indicating the associated channel for selecting the servo error signal for ADC conversion.

7. The method as recited in claim 1, further comprising:

storing servo routines configured to process the converted digital data for generating the correction data, one servo routine per servo channel, each servo routine being configured to process the associated servo digital data to generate the associated correction data, wherein a servo routine associated with the accessed entry is executed to generate the correction data.

8. The method as recited in claim 7, wherein each data entry includes a starting address to an associated servo routine, wherein the servo routines are stored at the corresponding starting addresses in a storage device to be executed upon expiration of an ADC conversion time.

9. A method for processing servo channel signals using a circular linked list, the circular linked list having a plurality of entries for processing a plurality of servo error signals, one entry for each servo error channel, each entry being programmable to include a set of data for processing a servo error signal, the set of data including a time interval that specifies a duration needed for processing a digital data corresponding to the associated servo error signal, the servo error signals being associated with servo channels, the method comprising:

determining and storing a time for converting a servo error signal into a digital data format as an ADC conversion time;

receiving a stream of a plurality of servo error signals over the servo error channels;

accessing an entry from the circular linked list for processing a servo error signal associated with the entry;

converting the servo error signal into digital data during the ADC conversion time;

upon expiration of the ADC conversion time, processing the converted digital data during the time interval specified in the accessed entry to generate a correction data at the end of the time interval; and while processing the converted digital data to generate the correction data, accessing a next entry from the circular linked list at one ADC conversion time before the expiration of the time interval associated with the previous entry and converting a servo error signal associated with the next entry into a next digital data such that thee next digital data is available for processing when the previous correction data is generated for output.

10. The method as recited in claim 9, wherein the servo error signal is provided to an ADC, which converts the servo error signal into the digital data.

11. The method as recited in claim 9, wherein the circular linked list is stored in a programmable circular buffer.

12. The method as recited in claim 9, wherein the plurality of entries of the circular linked list is stored in a register file having a plurality of registers.

13. The method as recited in claim 9, wherein each entry includes a channel ID for indicating the associated channel for selecting the servo error signal for ADC conversion.

14. The method as recited in claim 9, further comprising:

storing servo routines configured to process the converted digital data for generating the correction data, one servo routine per servo channel, each servo routine being configured to process the associated servo digital data to generate the associated correction data, wherein a servo routine associated with the accessed entry is executed to generate the correction data.

15. The method as recited in claim 9, wherein each entry includes a starting address to an associated servo routine, wherein the servo routines are stored at the corresponding starting addresses in a storage device to be executed upon expiration of an ADC conversion time.

16. A servo device for sequencing the processing of servo error signals to minimize latency, comprising:

an analog switch configured to receive a stream of a plurality of servo error signals each servo error signal being associated with a servo channel, the analog switch being configured to select a servo channel signal in response to a channel ID;

an ADC coupled to the analog switch to receive the selected servo channel signal, the ADC being operable to convert the selected servo channel signal into servo digital data within an ADC conversion time; and a circular storage device for storing a circular linked list having a plurality of entries for processing the stream of the plurality of servo error signals, one entry for each servo error channel, each entry being programmable to include a set of data for processing a servo error signal, the set of data including a channel ID and a time interval that specifies a duration needed for processing a digital data corresponding to the associated servo error signal; and sequencing circuitry configured to sequentially access the entries in the circular linked list for selecting servo error signals for ADC conversion and DSP processing, the sequencing circuitry triggering the ADC to read a next channel ID for ADC conversion at one ADC conversion time before the expiration of the time interval for the previous entry.

17. The servo device as recited in claim 16, wherein the circular storage device is a programmable circular buffer.

18. The servo device as recited in claim 16, wherein the circular storage device is a register file having a plurality of registers.

19. The servo device as recited in claim 16, wherein each entry includes a channel ID for indicating the associated channel for selecting the servo error signal for ADC conversion.

20. The method as recited in claim 16, wherein each entry includes a starting address to an associated servo routine that is configured to process the converted digital data for generating the correction data, wherein the servo routines are stored at the corresponding starting addresses in a storage device to be executed upon expiration of an ADC conversion time.

21. The servo device as recited in claim 16, wherein the sequencing circuitry includes:

a interval register for storing the time interval;

a subtractor for computing a result of one ADC conversion time before the expiration of the time interval for the previous entry;

an interval timer for keeping track of the passage of time; and a first comparator for comparing the content of the interval register and the interval timer to generate an EQUAL signal, which resets the interval timer for processing servo digital data; and a second comparator for comparing the result from the subtractor and the interval timer for triggering the ADC to read the selected servo channel signal.

22. The servo device as recited in claim 16, wherein the sequencing circuitry generates a read trigger signal to trigger the ADC to read the servo error signal.

* * * * *